(12) United States Patent
 Nakamura (10) Patent No.: US 9,091,733 B2
(45) Date of Patent: Jul. 28, 2015

(54) METHOD OF INSPECTING SECONDARY BATTERY

(71) Applicant: Seigo Nakamura, Toyota (JP)

(72) Inventor: Seigo Nakamura, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 183 days.

(21) Appl. No.: 13/949,272

(22) Filed: Jul. 24, 2013

(65) Prior Publication Data

US 2014/0028320 A1    Jan. 30, 2014

(30) Foreign Application Priority Data

Jul. 27, 2012 (JP) ................................ 2012-167793

(51) Int. Cl.
```
G01N 27/416    (2006.01)
G01R 31/36     (2006.01)
H01M 10/44     (2006.01)
H01M 10/42     (2006.01)
```
(52) U.S. Cl.
CPC .......... *G01R 31/362* (2013.01); *G01R 31/3641* (2013.01); *H01M 10/446* (2013.01); *H01M 10/448* (2013.01); *H01M 2010/4278* (2013.01)

(58) Field of Classification Search
USPC ........................................................ 324/426
See application file for complete search history.

(56) References Cited

U.S. PATENT DOCUMENTS

| | | | |
|---|---|---|---|
| 6,424,158 B2 * | 7/2002 | Klang ........................... | 324/433 |
| 6,469,471 B1 * | 10/2002 | Anbuky et al. ............... | 320/118 |
| 2005/0118497 A1 * | 6/2005 | Breen ............................. | 429/93 |
| 2005/0242820 A1 * | 11/2005 | Kume et al. .................. | 324/426 |
| 2012/0182020 A1 | 7/2012 | Akutsu et al. | |
| 2013/0141107 A1 * | 6/2013 | Yuasa ........................... | 324/426 |

FOREIGN PATENT DOCUMENTS

| | | |
|---|---|---|
| JP | 7-176334 | 7/1995 |
| JP | 10-289729 | 10/1998 |
| JP | 2001-313086 | 11/2001 |
| JP | 2002-131402 | 5/2002 |
| JP | 2002-334722 | 11/2002 |
| JP | 2011-252930 | 12/2011 |

* cited by examiner

*Primary Examiner* — Yalkew Fantu
(74) *Attorney, Agent, or Firm* — Finnegan, Henderson, Farabow, Garrett & Dunner, LLP

(57) ABSTRACT

A method of inspecting a secondary battery includes: discharging the secondary battery initially charged, at a discharge current, from an initial voltage to a discharge ending voltage; calculating an interval capacity in a voltage interval from a check starting voltage to a check ending voltage, based on the discharge current, and discharge time taken in the voltage interval; measuring a voltage change amount from a point in time when the voltage reaches a first voltage to a point in time when a length of time elapses from the above point in time, when the secondary battery is discharged from the initial voltage to the discharge ending voltage; and determining whether a total capacity satisfies a performance requirement, by comparing the calculated interval capacity with a first threshold value, and determining whether an output satisfies a performance requirement, by comparing the measured voltage change amount with a second threshold value.

5 Claims, 7 Drawing Sheets

METHOD OF INSPECTING SECONDARY BATTERY

INCORPORATION BY REFERENCE

The disclosure of Japanese Patent Application No. 2012-167793 filed on Jul. 27, 2012 including the specification, drawings and abstract is incorporated herein by reference in its entirety.

BACKGROUND OF THE INVENTION

1. Field of the Invention

The invention relates to a method of inspecting a secondary battery, which method can reduce the time required to inspect the secondary battery.

2. Description of Related Art

When secondary batteries, such as lithium-ion batteries, are manufactured and shipped, some initial characteristics, such as the capacity and the output or power, of the secondary batteries are checked in a pre-shipping inspection process. To check the capacity and output of a secondary battery, for example, in the pre-shipping inspection process, an activation treatment for activating the secondary battery by initially charging the battery, and a high-temperature aging treatment, are performed. After the activation treatment and the high-temperature aging treatment, the secondary battery is discharged until its voltage becomes equal to a specified voltage, and its capacity is measured. Then, the temperature and voltage (SOC: State Of Charge) of the secondary battery are suitably controlled, and the secondary battery is discharged at a specified current for a certain period of time, for measurement of the IV resistance, whereby the output of the secondary battery is measured.

In a process of manufacturing secondary batteries as described in Japanese Patent Application Publication No. 10-289729 (JP 10-289729 A), after the secondary batteries are subjected to a high-temperature aging treatment and an activation treatment, the batteries are left to stand for a given period of time (first buffering step), and then the capacity of each battery is checked. Then, after the secondary batteries are further left stand for a given period of time (second buffering step), the open-circuit voltage (OCV) is measured, and the secondary batteries are sorted out according to the current capacity value, so that selected ones of the secondary batteries are shipped.

As described above, in the pre-shipping inspection process of measuring the capacity and output of the secondary battery, the discharge for measuring the capacity and the discharge for measuring the output are separately carried out, and, therefore, a large amount of inspection time is required. Also, in the inspection process as described in JP 10-289729 A, since the secondary batteries are left to stand and the open-circuit voltage is measured, after the battery capacity is checked, the SOC and temperature of the secondary batteries need to be controlled after measurement of the capacity, and a large amount of time is required for the inspection process.

SUMMARY OF THE INVENTION

The invention provides a method of inspecting a secondary battery, with which the inspection time can be shortened and the cost required for the inspection process can be reduced.

According to one aspect of the invention, a method of inspecting a secondary battery includes the steps of: discharging the secondary battery that has been initially charged, at a given discharge current, from a given initial voltage to a discharge ending voltage; setting a voltage interval, the voltage interval being an interval from a given check starting voltage to a check ending voltage that is lower than the check starting voltage, as a checking interval of an interval capacity of the secondary battery within a voltage range between the initial voltage and the discharge ending voltage, and calculating the interval capacity based on the discharge current, and discharge time it takes for a voltage of the secondary battery to vary from the check starting voltage to the check ending voltage; measuring a voltage change amount as an amount of change in the voltage of the secondary battery from a first point in time at which the voltage of the secondary battery reaches a certain first voltage within the voltage range, to a second point in time at which a given length of time elapses from the first point in time, when the secondary battery is discharged from the initial voltage to the discharge ending voltage; and determining whether a total capacity of the secondary battery having a correlation with the interval capacity satisfies a performance requirement, by comparing the calculated interval capacity with a first threshold value, and determining whether an output of the secondary battery having a correlation with the voltage change amount satisfies a performance requirement, by comparing the measured voltage change amount with a second threshold value.

According to the above aspect of the invention, the inspection time in the pre-shipping inspection is shortened, and the cost required for the inspection process is reduced.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

One embodiment of the invention will be described with reference to the drawings.

Figure 1:
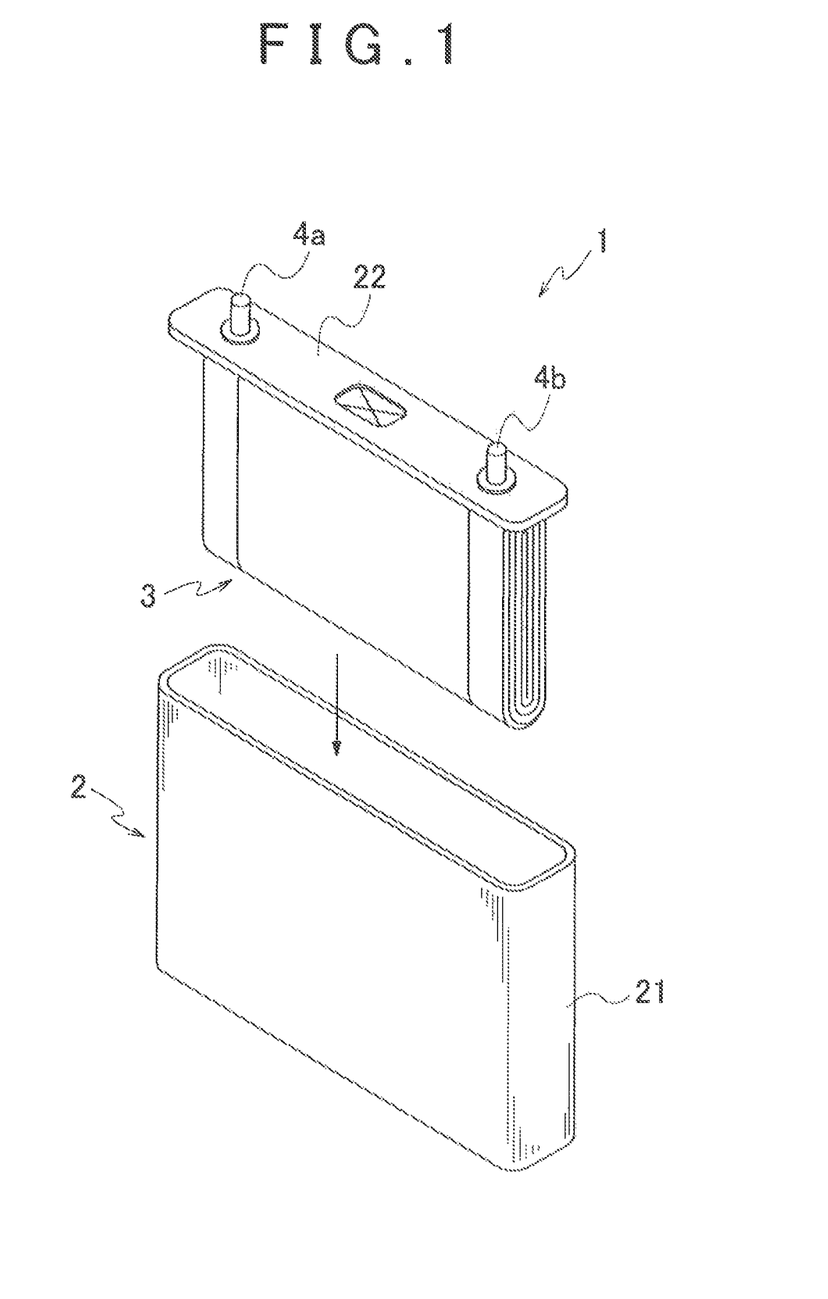
FIG. 1 is a perspective view showing a secondary battery to be inspected by a pre-shipping inspection method according to one embodiment of the invention.

FIG. 1 shows a secondary battery 1 to be inspected by a pre-shipping secondary-battery inspection method according to this embodiment. The secondary battery 1 is, for example, a lithium-ion secondary battery. As shown in FIG. 1, the secondary battery 1 has a battery case 2, and an electrode body 3 is housed, along with an electrolyte, in the battery case 2.

The battery case 2 consists of a main body 21 and a lid 22. The main body 21 is a rectangular parallelepiped or rectangular cylinder, which has an opening formed at one side (upper face) thereof, and a bottom formed at the other side opposite to the opening. That is, the battery case 2 is a rectangular case formed by closing the opening of the main body 21 with the lid 22 in the form of a flat plate. A positive terminal 4a is provided on one end portion (left end portion in FIG. 1) of the lid 22 as viewed in the longitudinal direction thereof, and a negative terminal 4b is provided on the other end portion (right end portion in FIG. 1) of the lid 22 as viewed in the longitudinal direction.

The electrode body 3 has a positive electrode, a negative electrode, and a separator. The positive electrode, negative electrode, and the separator are laminated or stacked together such that the separator is interposed between the positive electrode and the negative electrode. The laminated positive electrode, negative electrode, and separator are wound and flattened, thereby to form the electrode body 3. As a positive-electrode active material of the positive electrode in the secondary battery 1, a ternary active material, such as an active material containing $Li(Ni, Mn, Co)O_2$, may be used.

When the secondary battery 1 is formed by placing the electrode body 3 and the electrolyte in the battery case 2, the positive terminal 4a and negative terminal 4b of the lid 22 are connected to the positive electrode and negative electrode of the electrode body 3, respectively. Then, the electrode body 3 is attached to and assembled with the lid 22, to form a lid sub-assembly. Then, the electrode body 3 and the electrolyte are put into the main body 21 of the battery case 2, and the lid 22 is fitted in the opening of the main body 21. Then, the lid 22 and the main body 21 of the battery case 2 are sealed by welding, so that the secondary battery 1 is formed.

Figure 2:
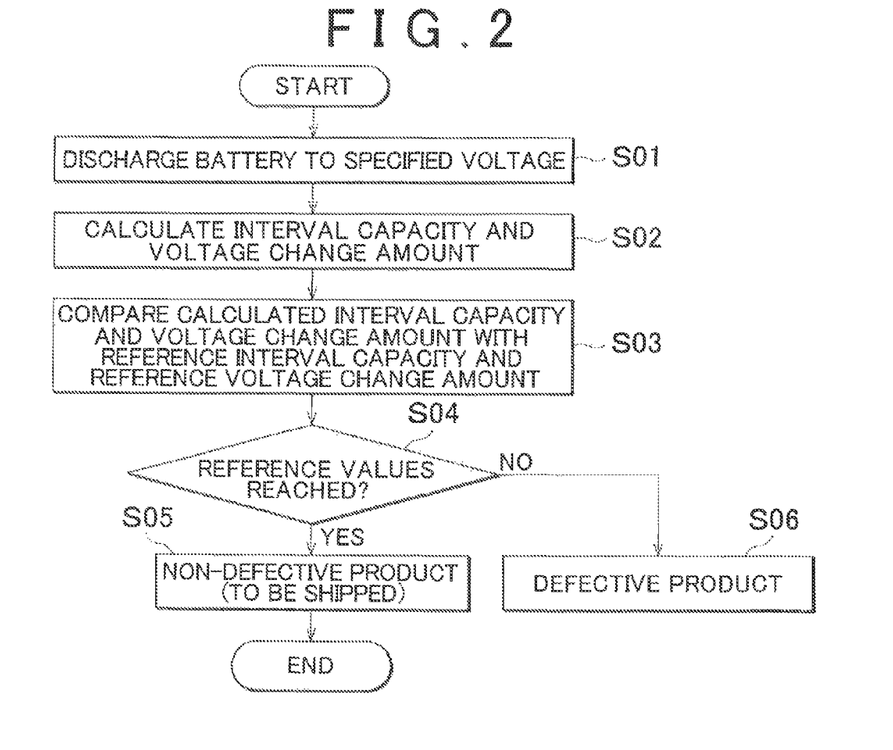
FIG. 2 is a view illustrating the flow of the pre-shipping secondary-battery inspection method.

The secondary battery 1 thus formed is inspected in terms of its initial characteristics, such as the capacity and the output, in a pre-shipping inspection process during manufacturing. Here, the output may be regarded as electric power (W), for example. The capacity and output of the secondary battery 1 are checked by discharging the secondary battery 1 that has been initially charged, only once, as shown in the flow of FIG. 2. The method of checking the capacity and output of the secondary battery 1 in the pre-shipping inspection process will be specifically described.

Figure 3:
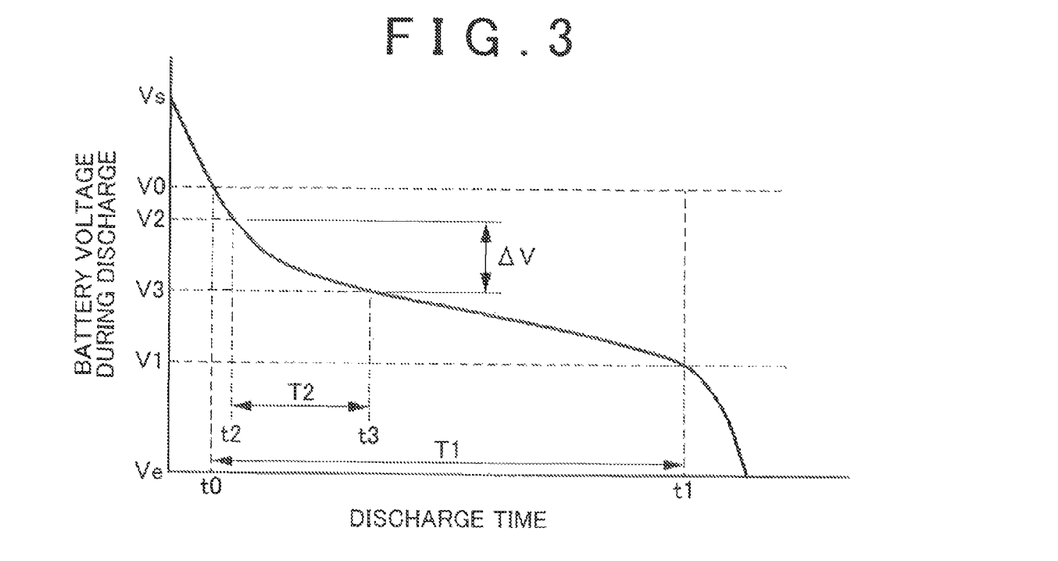
FIG. 3 is a view indicating a discharge curve of the secondary battery.

To check the capacity and output of the secondary battery 1, the secondary battery 1 that has been initially changed is discharged at a given current value I (e.g., 2.4 C) such that its voltage varies from a given initial voltage Vs (e.g., 4.0V) to a discharge ending voltage Ve (e.g., 3.0V), as shown in FIG. 3. In this case, the discharge starting voltage (initial voltage Vs) of the secondary battery 1 is preferably set to 3.65V to 4.1V, more preferably, set to 3.95V to 4.1V. The discharge current is preferably set to 1 C to 10 C, more preferably, set to 2 C to 6 C. The inspection temperature is preferably set to 10° C. to 30° C. A discharge curve of the secondary battery 1 is shown in FIG. 3, in which the horizontal axis indicates time, and the vertical axis indicates the battery voltage during discharge.

Then, an interval capacity check starting voltage V0 and an interval capacity check ending voltage V1 (V1<V0) are set within the range from the initial voltage Vs to the discharge ending voltage Ve, so that a checking interval of the interval capacity is set. Here, the checking interval may be regarded as a voltage interval set for checking the interval capacity. The interval capacity check starting voltage V0 may be regarded as the check starting voltage of the invention, and the interval capacity check ending voltage V1 may be regarded as the check ending voltage of the invention. The interval capacity of the secondary battery 1 is calculated, using the discharge current value I at which the secondary battery 1 is discharged in step S01, and a period of time T1 from the interval capacity check starting time t0 to the interval capacity check ending time t1 (step S02). At the interval capacity check starting time t0, the voltage of the secondary battery 1 is equal to the interval capacity check starting voltage V0. At the interval capacity check ending time t1, the voltage of the secondary battery 1 is equal to the interval capacity check ending voltage V1. More specifically, the interval capacity of the secondary battery 1 is calculated by obtaining an integrated current amount within the voltage interval from the interval capacity check starting voltage V0 to the interval capacity check ending voltage V1, using the discharge current value I and the time T1.

Also, a second voltage V3 of the secondary battery 1 is measured at time t3 reached when a given length of time or fixed time T2 (which will be referred to as "elapsed time T2") elapses from time t2 at which the secondary battery 1 reaches a given first voltage V2, within the range from the initial voltage Vs to the discharge ending voltage Ve, and an amount ΔV of voltage change between the first voltage V2 and the second voltage V3 over the time period 12 from time t2 to time t3 is calculated (step S02).

Then, the calculated interval capacity is compared with a reference interval capacity as a threshold value that has been set in advance, and the calculated voltage change amount ΔV is compared with a reference voltage change amount as a threshold value that has been set in advance (step S03). The reference interval capacity as the threshold value may be regarded as the first threshold value of the invention, and the reference voltage change amount as the threshold value may be regarded as the second threshold value of the invention.

Figure 4:
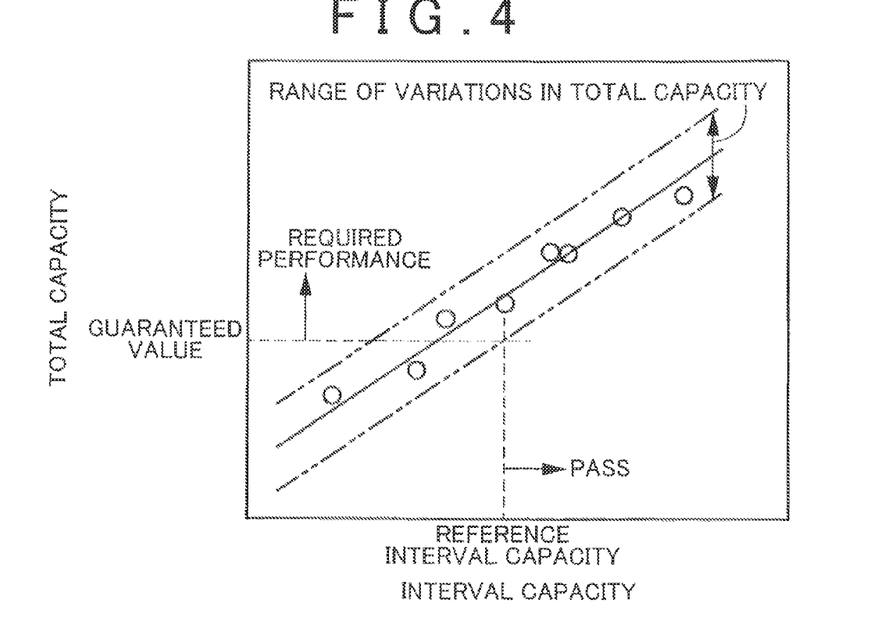
FIG. 4 is a view indicating the relationship between a guaranteed value of the total capacity of the secondary battery and a reference interval capacity.

As shown in FIG. 4, the interval capacity of the secondary battery 1 has a correlation with the total capacity (the capacity measured when the secondary battery 1 is discharged so that its SOC varies from 100% to 0%) of the secondary battery 1. Also, in FIG. 4, the interval capacity corresponding to the total capacity guaranteed to be provided by the secondary battery 1 (a guaranteed value of the total capacity) is set as the reference interval capacity. Accordingly, if it is determined, when the interval capacity calculated in step S02 is compared with the reference interval capacity in step S03, that the interval capacity is equal to or larger than the reference interval capacity, the total capacity of the secondary battery 1 under inspection satisfies a performance requirement, and the inspection result of the secondary battery 1 concerning the total capacity is determined as "pass". Namely, in step S03, the calculated interval capacity is compared with the first threshold value, so that it is determined whether the total capacity of the secondary battery having a correlation with the interval capacity satisfies the performance requirement. In other words, the result of determination on the total capacity is "good" when the interval capacity is equal to or larger than the first threshold value, and the result of determination on the total capacity is "no-good" when the interval capacity is smaller than the first threshold value.

Figure 5:
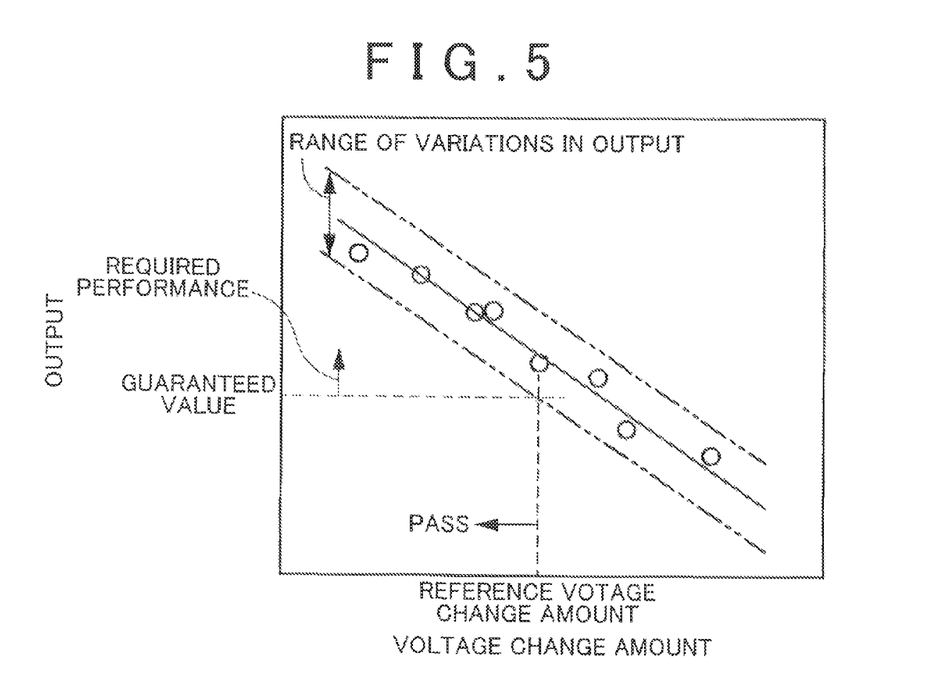
FIG. 5 is a view indicating the relationship between a guaranteed value of the output of the secondary battery and a reference voltage change amount.

As shown in FIG. 5, the reference voltage change amount of the secondary battery 1 has a correlation with the output of the secondary battery 1. In FIG. 5, the voltage change amount corresponding to the output guaranteed to be provided by the secondary battery 1 is set as the reference voltage change amount. Accordingly, if it is determined, when the voltage change amount ΔV calculated in step S02 is compared with the reference voltage change amount in step S03, that the voltage change amount ΔV is equal to or smaller than the reference voltage change amount, the output of the secondary battery 1 under inspection satisfies a performance requirement, and the inspection result of the secondary battery 1 concerning the output is determined as "pass". Namely, in step S03, the measured voltage change amount is compared with the second threshold value, so that it is determined whether the output of the secondary battery having a correlation with the voltage change amount satisfies the performance requirement. In other words, the result of determination on the output is "good" when the voltage change amount is equal to or smaller than the second threshold value, and the result of determination on the output is "no-good" when the voltage change amount is larger than the second threshold value.

If the interval capacity is equal to or larger than the reference interval capacity, and the voltage change amount ΔV is equal to or smaller than the reference voltage change amount, as a result of comparison between the interval capacity and the reference interval capacity and a result of comparison between the voltage change amount ΔV and the reference voltage change amount in step S03, namely, if it is determined that both the interval capacity and the voltage change amount ΔV achieve the reference values thereof (YES in step S04), it is determined that the secondary battery 1 under inspection satisfies the performance requirements, i.e., required total capacity and required output, and is a non-defective product (that can be shipped) (step S05). On the other hand, if at least the interval capacity is smaller than the reference interval capacity, or the voltage change amount ΔV is larger than the reference voltage change amount, as results of the above comparisons in step S03, namely, if at least one of the interval capacity and the voltage change amount ΔV does not achieve the corresponding reference value (NO in step S04), it is determined that the secondary battery 1 does not satisfy at least one of the performance requirements, i.e., required total capacity and required output, and is a defective product (that cannot be shipped) (step S06).

Thus, in the method of inspecting the secondary battery 1 before shipping according to this embodiment, the secondary battery 1 is discharged only once, and the total capacity and the output are simultaneously checked. Also, the output of the secondary battery 1 is checked by calculating the voltage change amount ΔV using the discharge result (discharge curve) used for measurement of the capacity, without measuring the IV resistance of the secondary battery 1. Thus, the inspection time required for the pre-shipping inspection is shortened, and the cost required in the inspection process is reduced.

Figure 6:
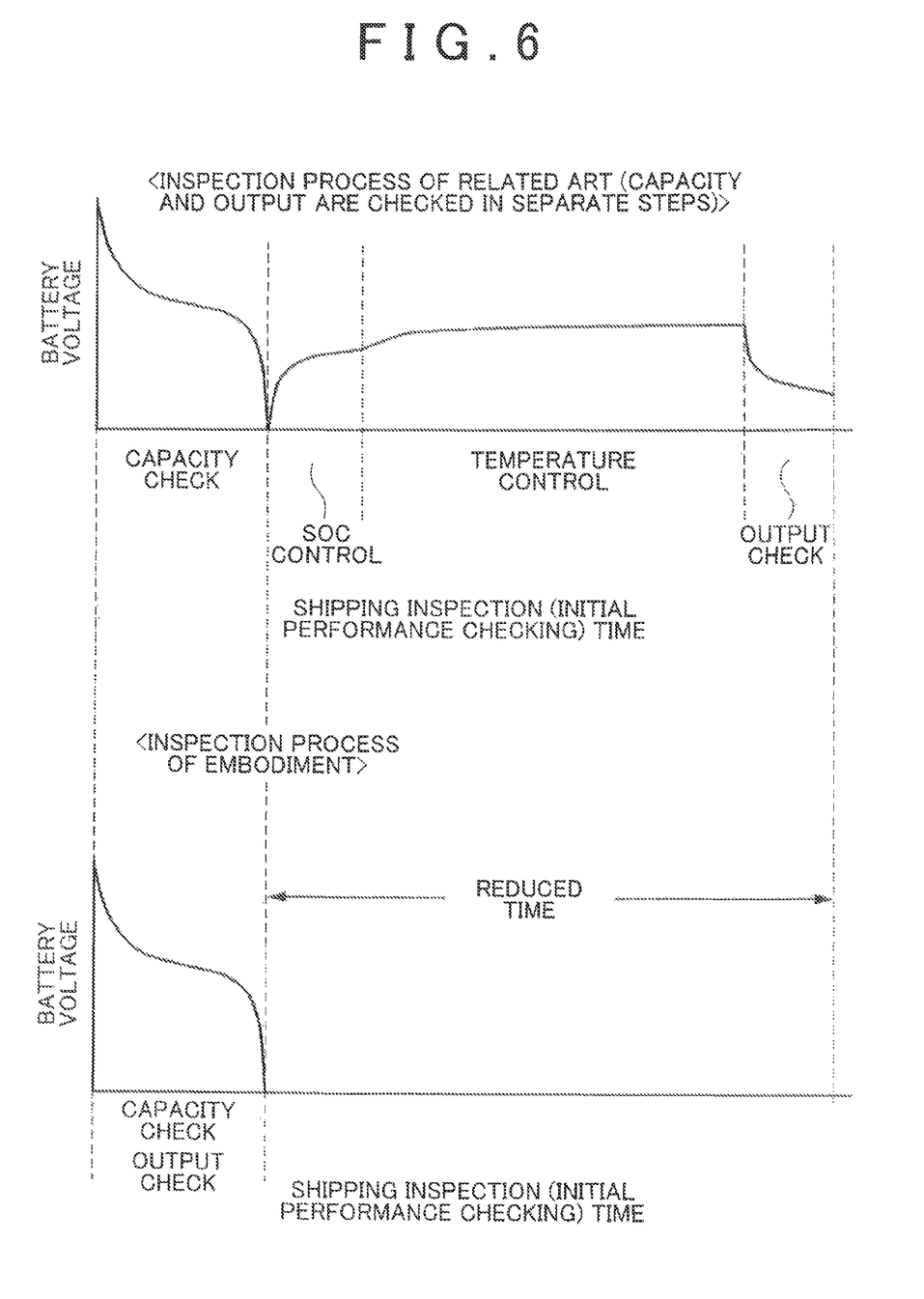
FIG. 6 is a view indicating the shipping inspection time of an inspection process of the related art and the inspection time of the inspection process of the embodiment.

As one example, the related art with which the capacity and output of the secondary battery are checked in separate steps, in the pre-shipping inspection process, is illustrated in FIG. 6. In the related art, after the secondary battery is discharged for checking of the capacity, the SOC and the temperature of the secondary battery are controlled, and the battery is additionally discharged for checking of the output, thus requiring a long period of time for the pre-shipping inspection process. On the other hand, if the capacity and the output are both checked through a single discharge, as in this embodiment, the steps of controlling the SOC and controlling the temperature, and the step of conducting the second discharge, can be omitted, and the time required for the pre-shipping inspection process is significantly shortened.

Figure 7:
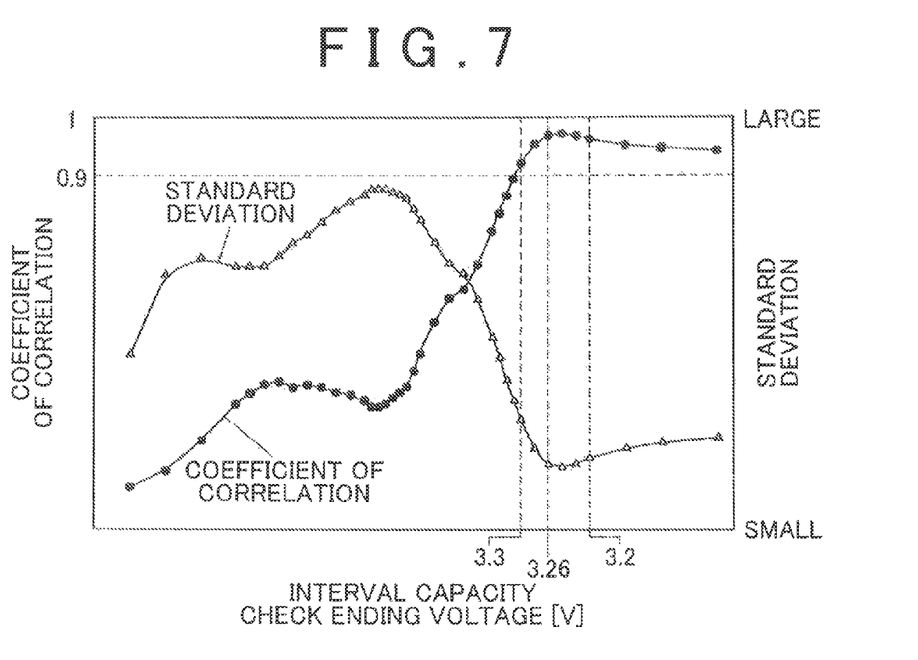
FIG. 7 is a view indicating the relationships between the interval capacity check ending voltage, and the coefficient of correlation between the interval capacity and the total capacity and the standard deviation of the interval capacity, when the interval capacity check starting voltage is fixed.

While the interval capacity calculated with respect to the secondary battery 1 is correlated with the total capacity of the secondary battery 1, as described above, the degree of correlation varies depending on values of the interval capacity check starting voltage V0 and the interval capacity check ending voltage V1 set for calculation of the interval capacity. FIG. 7 shows the coefficient of correlation between the interval capacity from the interval capacity check starting voltage V0 to the interval capacity check ending voltage V1, and the total capacity, in the secondary battery 1 whose capacity when it is discharged from 4.1V (SOC 100%) to 3.0V (SOC 0%) is regarded as the total capacity. In FIG. 7, the secondary battery is discharged at a current of 2.4 C from the initial voltage Vs (4.0V) to the discharge ending voltage Ve (3.0V), and the interval capacity is calculated with the interval capacity check starting voltage V0 being fixed to 4.0V, and the interval capacity check ending voltage V1 being varied.

As is understood from FIG. 7, when the interval capacity check ending voltage V1 is equal to or lower than 3.3V, the coefficient of correlation between the interval capacity and the total capacity is equal to or larger than 0.9, which means that there is a high correlation between the interval capacity and the total capacity. Accordingly, if the interval capacity check starting voltage V0 is set to 4.0V when the interval capacity of the secondary battery 1 is calculated in step S02, it is preferable to set the interval capacity check ending voltage V1 to be equal to or lower than 3.3V. When the interval capacity check ending voltage V1 is set to be equal to or lower than 3.3V, variations (standard deviation) in the calculated interval capacity are reduced, thus assuring improved inspection accuracy.

Figure 8:
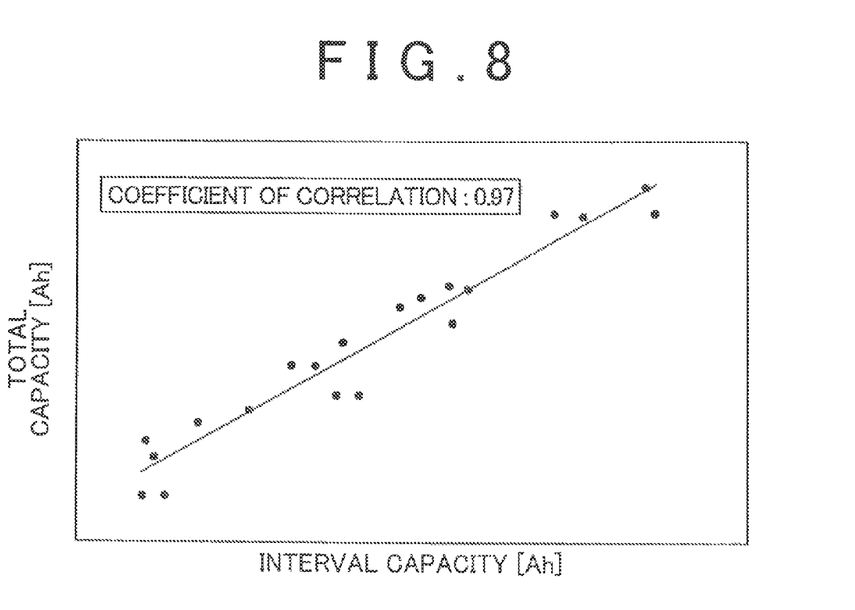
FIG. 8 is a view indicating correlation between the interval capacity and the total capacity, when the interval capacity check starting voltage is set to 4.0V, and the interval capacity check ending voltage is set to 3.24V.

The coefficient of correlation between the interval capacity and the total capacity is highest when the interval capacity check ending voltage V1 is within the range of 3.26V to 3.20V. Therefore, it is more preferable to set the interval capacity check ending voltage V1 to within the range of 3.26V to 3.20V when the interval capacity of the secondary battery 1 is calculated with the initial voltage V0 being set to 4.0. When the interval capacity check ending voltage V1 is set to within the range of 3.26V to 3.20V, variations (standard deviation) in the calculated interval capacity are minimized, thus assuring further improved inspection accuracy. For example, if the interval capacity is calculated by discharging the secondary battery with the interval capacity check stating voltage V0 being set to 4.0V, and the interval capacity check ending voltage V1 being set to 3.24V, as shown in FIG. 8, the coefficient of correlation between the interval capacity and the total capacity is 0.97.

Thus, when the interval capacity check starting voltage V0 is set to 4.0V, it is preferable to set the interval capacity check ending voltage V1 to 3.3V or lower, and it is more preferable to set the interval capacity check ending voltage V1 to within the range of 3.26V to 3.20V. When the interval capacity check starting voltage V0 is set to another voltage level, it is preferable to set the interval capacity check ending voltage V1 so that the coefficient of correlation between the interval capacity and the total capacity becomes equal to or larger than 0.9.

When the interval capacity check starting voltage V0 and the interval capacity check ending voltage V1 are set to respective values that are determined so that the coefficient of correlation between the interval capacity and the total capacity becomes equal to or larger than 0.9, data of the interval capacity and total capacity obtained from a secondary battery model known as a non-defective product are used for calculation of the correlation coefficient. Namely, the interval capacity check starting voltage V0 and the interval capacity check ending voltage V1 are set to respective values that are determined so that the coefficient of correlation between the interval capacity and total capacity of the secondary battery model known as a non-defective product becomes equal to or larger than 0.9. As a result, the capacity of the secondary battery 1 can be checked with high accuracy.

As described above, the voltage change amount $\Delta V$ measured with respect to the secondary battery 1 is correlated with the output of the secondary battery 1. On the other hand, the degree of the correlation varies depending on the first voltage V2 and a value of elapsed time T2 from time t2. Here, the first voltage V2 is used when the voltage change amount $\Delta V$ is calculated. Furthermore, at the time t2, the voltage of the secondary battery 1 reaches the first voltage V2. More specifically, the coefficient of correlation between the voltage change amount $\Delta V$ and the output from time t2 to time t3, when the elapsed time T2 is varied while the first voltage V2 is fixed to 3.87V, is shown in FIG. 9.

Figure 9:
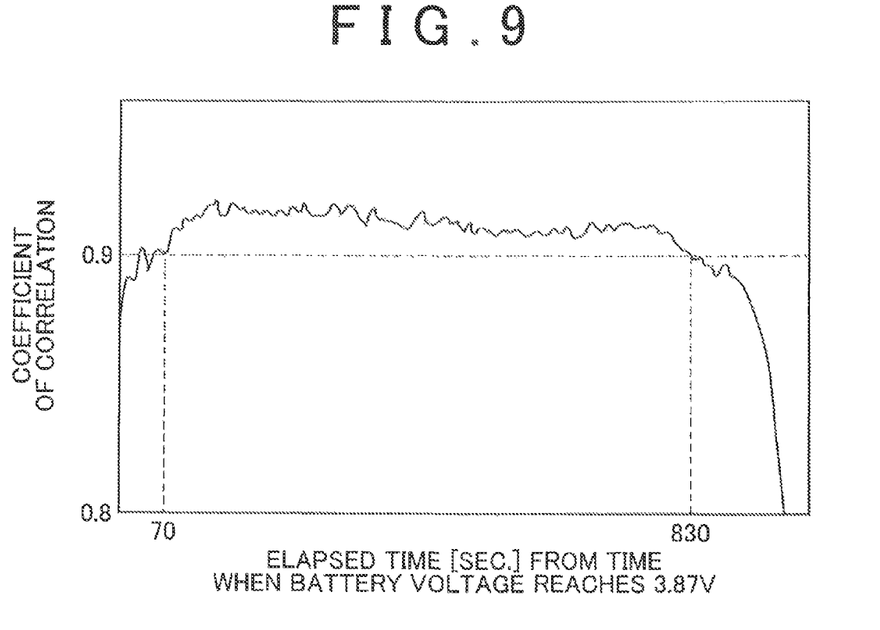
FIG. 9 is a view indicating correlation between the voltage change amount measured after a lapse of a given time from the time when the battery voltage reaches 3.87V during discharge, and the output.
Figure 10:
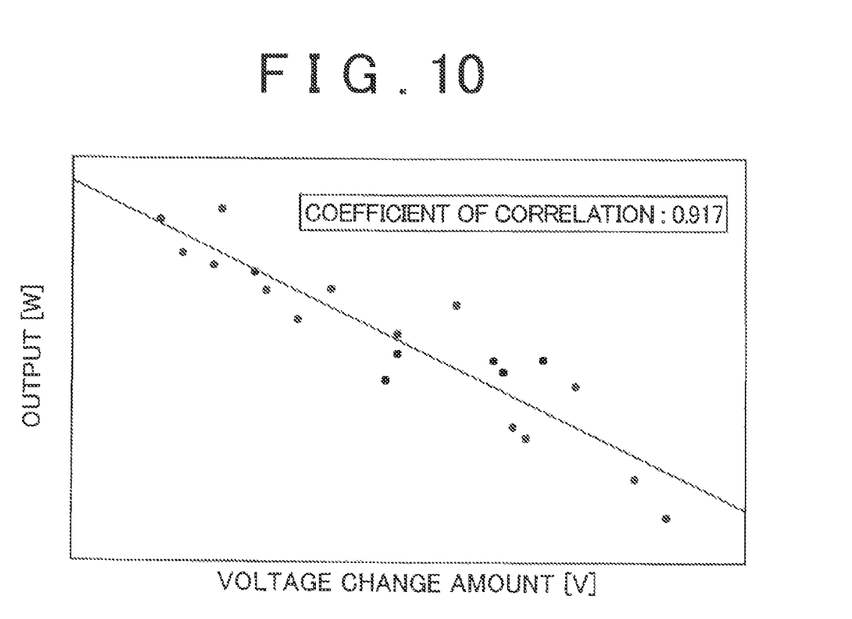
FIG. 10 is a view indicating correlation between the voltage change amount measured after a lapse of 200 seconds from the time when the battery voltage reaches 3.87V during discharge, and the output.

As is understood from FIG. 9, when the elapsed time T2 is equal to or longer than 70 seconds and is equal to or shorter than 830 seconds, the coefficient of correlation between the voltage change amount $\Delta V$ and the output is equal to or larger than 0.9, which means that there is a high correlation between the voltage change amount $\Delta V$ and the output. Accordingly, when the voltage change amount $\Delta V$ of the secondary battery 1 is calculated in step S02, it is preferable to set the voltage V2 to 3.87V, and set the elapsed time T2 to be equal to or longer than 70 seconds and equal to or shorter than 830 seconds. For example, if the voltage V2 as the starting voltage when the voltage change amount $\Delta V$ is calculated is set to 3.87V, and the elapsed time T2 is set to 200 seconds, as shown in FIG. 10, the coefficient of correlation between the voltage change amount $\Delta V$ and the output is 0.917.

Thus, when the voltage V2 is set to 3.87V, it is preferable to set the elapsed time T2 to be equal to or longer than 70 seconds and equal to or shorter than 830 seconds. Even when the ambient temperature and the voltage V2 are set to other values, it is preferable to set the elapsed time 12 so that the coefficient of correlation between the voltage change amount $\Delta V$ and the output becomes equal to or larger than 0.9. Namely, the first voltage V2 and given time T2 used when the voltage change amount is measured may be set to respective values that are determined so that the coefficient of correlation between the output and the voltage change amount with respect to a secondary battery model known as a non-defective product becomes equal to or larger than 0.9.

Accordingly, when the voltage change amount $\Delta V$ is calculated in step S02, the coefficient of correlation between the output and voltage change amount of the secondary battery model known as a non-defective product is calculated in advance with the first voltage V2 being varied and the elapsed time T2 being varied. Then, the result of calculation is used for setting the values of the first voltage V2 and elapsed time T'2 to such values that the coefficient of correlation between the output and voltage change amount $\Delta V$ of the secondary battery model becomes equal to or larger than 0.9. As a result, the output of the secondary battery 1 can be checked with high accuracy.

Next, the result of determination whether the secondary battery 1 can be inspected with high accuracy, when the pre-shipping inspection of the secondary battery 1 is carried out by the pre-shipping inspection method of this embodiment, will be described.

Initially, twenty samples of secondary batteries 2 on which the pre-shipping inspection according to the pre-shipping inspection method of this embodiment was performed were prepared. The design capacity of these samples was varied among eight levels within the range of 0-3%, by varying the electrode length thereof. As a test example, each of these samples was discharged only once at a current of 2.4 C from 4.0V to 3.0V, under an environment of 20° C.

The result of the capacity checking will be indicated below. Aside from the test example as described above, each of the samples was subjected to constant-voltage discharge (CV discharge) so that its voltage varies from 4.1V (SOC 100%) to 3.0V (SOC 0%), so that the total capacity of each sample was measured. For each sample, the interval capacity check starting voltage V0 was set to 3.85V, while the interval capacity check ending voltage V1 was set to 3.28V, and the interval capacity from the interval capacity check starting voltage V0 to the interval capacity check ending voltage V1 was calculated, using discharge data obtained in the above test example. Then, for each sample, the measured total capacity was compared with the calculated interval capacity, so that the correlation between the total capacity and the interval capacity was checked.

Figure 11:
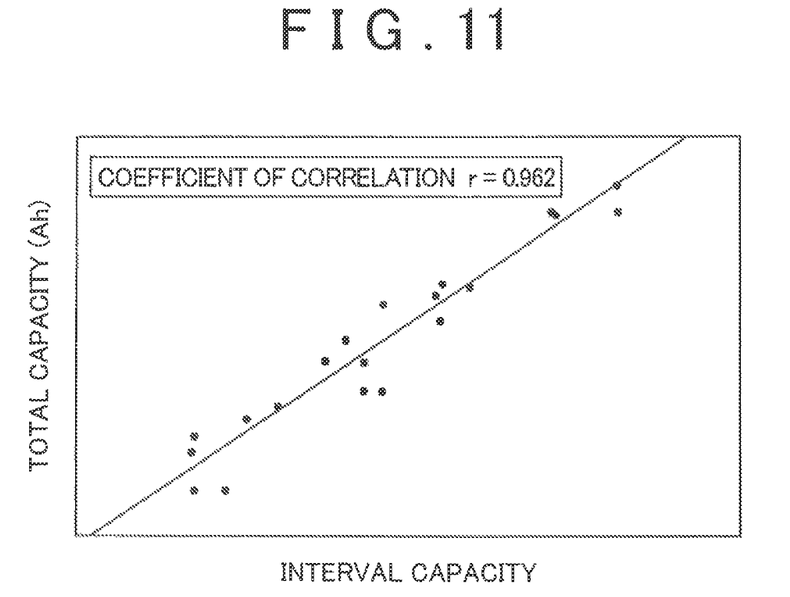
FIG. 11 is a view indicating the result of capacity check performed by the pre-shipping inspection method of the embodiment.

FIG. 11 shows a graph indicating the correlation between the total capacity and the interval capacity of each sample. It is understood from FIG. 11 that the coefficient r of correlation between the total capacity and the interval capacity is 0.962, which is higher than 0.9, and there is a high correlation between the total capacity and the interval capacity.

The result of the output checking will be indicated below. Aside from the test example as described above, the output of each sample was measured under an environment of a low temperature. For each sample, the first voltage V2 used when checking the output was set to 3.87V, while the elapsed time T2 was set to 200 seconds. Furthermore, the voltage change amount $\Delta V$ from time t2 at which the voltage reached the first voltage V2 to time t3 reached upon a lapse of the elapsed time T2 from time t2 was calculated. Then, for each sample, the measured output was compared with the calculated voltage change amount $\Delta V$, and the correlation between the output and the voltage change amount was checked.

Figure 12:
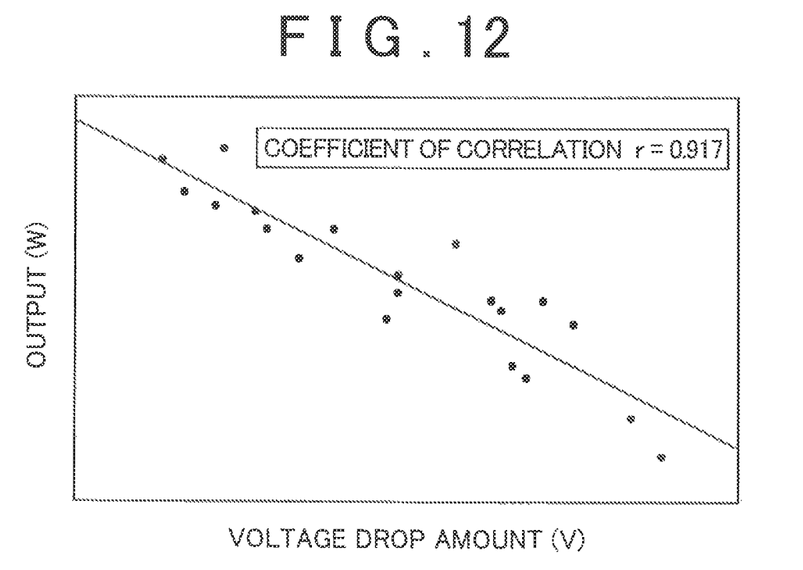
FIG. 12 is a view indicating the result of output check performed by the pre-shipping inspection method of the embodiment.

FIG. 12 shows a graph indicating the correlation between the output and voltage change amount $\Delta V$ of each sample. It is understood from FIG. 12 that the coefficient r of correlation between the output and the voltage change amount $\Delta V$ is 0.917, which is higher than 0.9, and there is a high correlation between the output and the voltage change amount.

Thus, even when the secondary battery 1 is discharged only once, and the capacity and output of the secondary battery 1 are checked by using the interval capacity and the voltage change amount $\Delta V$ in the data obtained from the discharge, both the capacity and the output can be checked with high accuracy.

What is claimed is:

1. A method of inspecting a secondary battery, comprising:
discharging the secondary battery that has been initially charged, at a given discharge current, from a given initial voltage to a discharge ending voltage;
setting a voltage interval, the voltage interval being an interval from a given check starting voltage to a check ending voltage that is lower than the check starting voltage, as a checking interval of an interval capacity of the secondary battery within a voltage range between the initial voltage and the discharge ending voltage, and calculating the interval capacity based on the discharge current, and discharge time it takes for a voltage of the secondary battery to vary from the check starting voltage to the check ending voltage;
measuring a voltage change amount as an amount of change in the voltage of the secondary battery from a first point in time at which the voltage of the secondary battery reaches a certain first voltage within the voltage range, to a second point in time at which a given length of time elapses from the first point in time, when the secondary battery is discharged from the initial voltage to the discharge ending voltage; and
determining whether a total capacity of the secondary battery having a correlation with the interval capacity satisfies a performance requirement, by comparing the calculated interval capacity with a first threshold value, and determining whether an output of the secondary battery having a correlation with the voltage change amount satisfies a performance requirement, by comparing the measured voltage change amount with a second threshold value.

2. The method according to claim 1, wherein
the first voltage and the given length of time are set to respective values that are determined so that a coefficient of correlation between the output of a secondary battery model known as a non-defective product and the voltage change amount thereof becomes equal to or larger than 0.9.

3. The method according to claim 1, wherein
it is simultaneously determined whether the total capacity satisfies the performance requirement, and whether the output satisfies the performance requirement.

4. The method according to claim 1, wherein
the voltage change amount is calculated using a result of discharge used for calculation of the interval capacity.

5. The method according to claim 1, wherein:
it is determined that the total capacity of the secondary battery satisfies the performance requirement, when the calculated interval capacity is equal to or larger than the first threshold value; and
it is determined that the output of the secondary battery satisfies the performance requirement, when the measured voltage change amount is equal to or smaller than the second threshold value.

* * * * *